United States Patent
Delbruck et al.

[11] Patent Number: 5,838,176
[45] Date of Patent: Nov. 17, 1998

[54] CORRELATED DOUBLE SAMPLING CIRCUIT

[75] Inventors: Tobias Delbruck, Pasadena; Carver A. Mead, Cupertino, both of Calif.

[73] Assignee: Foveonics, Inc., Cupertino, Calif.

[21] Appl. No.: 867,472

[22] Filed: Jun. 2, 1997

Related U.S. Application Data

[63] Continuation-in-part of Ser. No. 679,686, Jul. 11, 1996.

[51] Int. Cl.$^6$ .................................................. G11C 27/02
[52] U.S. Cl. .................................. 327/95; 327/91; 327/94
[58] Field of Search ..................... 327/91, 94, 95, 327/33, 335, 337, 142, 198

[56] References Cited

U.S. PATENT DOCUMENTS

| | | | |
|---|---|---|---|
| Re. 34,309 | 7/1993 | Tanaka et al. | 358/213.31 |
| 3,532,945 | 10/1970 | Weckler | 317/235 |
| 3,911,269 | 10/1975 | Hart et al. | 250/211 |
| 4,293,877 | 10/1981 | Tsunekawa et al. | 358/213 |
| 4,377,742 | 3/1983 | Kawabata et al. | 250/204 |
| 4,450,466 | 5/1984 | Nishizawa et al. | 357/30 |
| 4,634,886 | 1/1987 | Hatanaka et al. | 250/578 |
| 4,652,766 | 3/1987 | Wang et al. | 250/578 |
| 4,682,236 | 7/1987 | Wang et al. | 358/213.26 |
| 4,683,580 | 7/1987 | Matsunaga | 377/60 |
| 4,686,554 | 8/1987 | Ohmi et al. | 357/30 |
| 4,734,776 | 3/1988 | Wang et al. | 358/213.31 |
| 4,743,955 | 5/1988 | Matsumoto | 357/30 |
| 4,751,559 | 6/1988 | Sugawa et al. | 357/30 |
| 4,757,200 | 7/1988 | Shepherd | 250/332 |
| 4,772,957 | 9/1988 | Nakagawa et al. | 358/280 |
| 4,791,286 | 12/1988 | Wall | 250/214 |
| 4,794,443 | 12/1988 | Tanaka et al. | 357/43 |
| 4,809,075 | 2/1989 | Akimoto et al. | 358/213.18 |
| 4,810,896 | 3/1989 | Tanaka et al. | 250/578 |
| 4,816,889 | 3/1989 | Matsumoto | 357/30 |
| 4,831,454 | 5/1989 | Tanaka et al. | 358/213.31 |
| 4,835,404 | 5/1989 | Sugawa et al. | 250/578 |
| 4,847,668 | 7/1989 | Sugawa et al. | 357/30 |
| 4,866,291 | 9/1989 | Shimada et al. | 250/578 |
| 4,866,293 | 9/1989 | Nakamura et al. | 250/578 |
| 4,870,266 | 9/1989 | Ishizaki et al. | 250/214 |
| 4,879,470 | 11/1989 | Sugawa et al. | 250/578 |
| 4,902,886 | 2/1990 | Smisko | 250/214 |
| 4,962,412 | 10/1990 | Shinohara et al. | 357/30 |
| 4,967,067 | 10/1990 | Hashimoto et al. | 250/208.1 |
| 4,972,243 | 11/1990 | Sugawa et al. | 357/30 |
| 4,977,096 | 12/1990 | Shimada et al. | 437/2 |
| 5,019,702 | 5/1991 | Ohzu et al. | 250/208.1 |
| 5,028,976 | 7/1991 | Ozaki et al. | 357/42 |
| 5,040,041 | 8/1991 | Yamada et al. | 357/30 |
| 5,060,042 | 10/1991 | Shinohara et al. | 357/30 |
| 5,101,252 | 3/1992 | Matsumoto | 357/30 |
| 5,113,254 | 5/1992 | Kanno et al. | 358/98 |
| 5,155,351 | 10/1992 | Yamanobe et al. | 250/211 |
| 5,182,446 | 1/1993 | Tew | 250/208.1 |
| 5,194,943 | 3/1993 | Tomita et al. | 358/32 |
| 5,216,510 | 6/1993 | Amingual et al. | 358/213.15 |
| 5,245,201 | 9/1993 | Kozuka et al. | 257/53 |
| 5,260,560 | 11/1993 | Yamanobe et al. | 250/214 |
| 5,283,428 | 2/1994 | Morishita et al. | 250/214.1 |
| 5,302,846 | 4/1994 | Matsumoto | 257/329 |
| 5,309,013 | 5/1994 | Suzuki et al. | 257/446 |
| 5,315,114 | 5/1994 | Kansy et al. | 250/332 |
| 5,335,008 | 8/1994 | Hamasaki | 348/301 |
| 5,345,266 | 9/1994 | Denyer | 348/300 |
| 5,384,596 | 1/1995 | Kobayashi et al. | 348/241 |

(List continued on next page.)

*Primary Examiner*—Toan Tran
*Attorney, Agent, or Firm*—Sierra Patent Group, Ltd.

[57] ABSTRACT

A correlated double sampling circuit comprising an input node comprising a first plate of input capacitor and an output node. A first plate of a feedback capacitor is connected to the output node and a second plate of the feedback capacitor is connected to a second plate of the input capacitor. An input transistor has a gate connected to the second plate of the input capacitor, a source connected to a first supply voltage rail, and a drain connected to the output node. A load transistor has a gate connected to a bias node, a drain connected to the output node, and a source connected to a second supply voltage rail. A reset transistor is connected between output node and the second plate of the input capacitor, and has a gate connected to a reset signal line.

1 Claim, 12 Drawing Sheets

U.S. PATENT DOCUMENTS

| | | | |
|---|---|---|---|
| 5,386,108 | 1/1995 | Arikawa et al. | 250/208.1 |
| 5,397,936 | 3/1995 | Wang | 327/94 |
| 5,401,952 | 3/1995 | Sugawa | 250/208.1 |
| 5,404,046 | 4/1995 | Matsumoto et al. | 257/750 |
| 5,414,275 | 5/1995 | Sugawa et al. | 257/53 |
| 5,428,237 | 6/1995 | Yuzurihara et al. | 257/349 |
| 5,428,391 | 6/1995 | Murata et al. | 348/240 |
| 5,453,611 | 9/1995 | Oozu et al. | 250/208.1 |
| 5,466,961 | 11/1995 | Kikuchi et al. | 257/379 |
| 5,479,121 | 12/1995 | Shen et al. | 327/94 |
| 5,481,124 | 1/1996 | Kozuka et al. | 257/185 |
| 5,506,525 | 4/1996 | Debroux | 327/94 |
| 5,512,750 | 4/1996 | Yanka et al. | 250/338.4 |
| 5,512,947 | 4/1996 | Sawachi et al. | 348/243 |
| 5,550,586 | 8/1996 | Kudo et al. | 348/222 |
| 5,557,121 | 9/1996 | Kozuka et al. | 257/292 |
| 5,591,960 | 1/1997 | Furukawa et al. | 250/208.1 |
| 5,598,023 | 1/1997 | Matsumoto | 257/462 |
| 5,598,037 | 1/1997 | Kikuchi et al. | 257/773 |
| 5,599,741 | 2/1997 | Matsumoto et al. | 437/192 |
| 5,600,152 | 2/1997 | Kozuka et al. | 257/55 |

CORRELATED DOUBLE SAMPLING CIRCUIT

CROSS REFERENCE TO RELATED APPLICATION

This application is a continuation-in-part of U.S. patent application Ser. No. 08/679,686, filed Jul., 11, 1996.

BACKGROUND OF THE INVENTION

1. Field of the Invention

The present invention relates to integrated circuit technology and imaging array technology and amplifier technology for use in integrated circuit applications. More particularly, the present invention relates to high density imaging array integrated circuits including sense amplifiers for use in such arrays incorporating correlated double sampling circuits.

2. The Prior Art

Sense amplifier circuits in general are known in the prior art. Sense amplifier circuits for use in imaging arrays are also known in the prior art.

A high-density photosensing imager may be realized by an array of bipolar transistors with bases capacitively coupled to sense lines, as previously disclosed by Mead et al. in U.S. Pat. Nos. 5,097,305, 5,260,592, and 5,324,958. In such an imager it is necessary to construct a sense amplifier that has a gain of 1000 or greater. It would be advantageous for such a sense amplifier to fit into a width of one pixel in the imager array (6 microns in a 1 micron process) so as to be able to provide a compact, efficient photosensing imager system. It is desirable that the sense amplifier have low noise, low power dissipation, and a compressive input-output characteristic such that it will decrease its gain gradually at large inputs rather than clip abruptly. Traditional amplifier designs either have too much noise or cannot be made to fit in the width available.

In addition, prior-art CMOS imager designs are plagued by large thermal kTC charge noise on the output column line connecting the pixel to the charge-sense amplifier. Any capacitance that is in thermal equilibrium displays thermal charge fluctuation; the mean-square charge fluctuation in units of square coulombs is kTC, where k is Boltzman's constant, T is the temperature in degrees Kelvin, and C is the capacitance in Farads.

Charge fluctuation on the column occurs while the charge-sense amplifier is being reset prior to sensing the pixel output. During reset, the sense amplifier is balanced by shorting the amplifier output to the column. During this phase of the sense cycle, the column is connected to a source of charge and comes to thermal equilibrium. For a typical column capacitance of 10 pF (1000 pixels each with 10 fF capacitance), the RMS charge fluctuation is about 1000 electrons.

It is therefore an object of the present invention to provide a sense amplifier which overcomes one or more shortcomings of the prior art.

Yet another object of the present invention is to provide a sense amplifier which can fit into the width of a single pixel in a photosensor array.

It is a further object of the present invention to provide a sense amplifier having low noise, low power dissipation, and a compressive input-output characteristic such that it will decrease its gain gradually at large inputs rather than clip abruptly.

Yet a further object of the present invention is to provide an integrated photosensing imager system including a sense amplifier which can fit into the width of a single pixel in a photosensor array.

A further object of the present invention is to provide a sense amplifier for an integrated photosensing imager system which can compensate for thermal charge fluctuation on column sense lines.

Another object of the present invention is to provide a sense amplifier for an integrated photosensing imager system which can operate accurately in the presence of large thermal kTC charge noise on the array output column lines.

BRIEF DESCRIPTION OF THE INVENTION

A sense amplifier according to a presently preferred embodiment of the invention comprises an input node and an output node. An input transistor has a gate connected to the input node, a source connected to a first supply voltage rail, and a drain. A cascode transistor has a gate connected to a cascode node, a source connected to the gate of the input transistor, and a drain connected to the output node. A load transistor has a gate connected to a bias node, a drain connected to the output node, and a source connected to a second supply voltage rail.

The gates of the cascode transistor and the load transistor are biased such that the input transistor and the cascode transistor are operated in weak inversion and the load transistor is operated in strong inversion. In a presently preferred embodiment of the present invention, the input transistor and the cascode transistor of the sense amplifier are wide and short, such that they operate in weak inversion (near the threshold voltage of the transistor), whereas the load transistor is made long and relatively narrow. The load transistor operates in strong inversion (well above the threshold voltage of the transistor).

The output of the sense amplifier is connected to the input of a correlated double sampling circuit comprising a first plate of input capacitor. An input transistor has a gate connected to the second plate of the input capacitor, a source connected to a first supply voltage rail, and a drain connected to an output node. A first plate of a feedback capacitor is connected to the output node and a second plate of the feedback capacitor is connected to a second plate of the input capacitor. A load transistor has a gate connected to a bias node, a drain connected to the output node, and a source connected to a second supply voltage rail. A reset transistor is connected between output node and the second plate of the input capacitor, and has a gate connected to a reset signal line.

According to another aspect of the present invention, a plurality of sense amplifiers and correlated double sampling circuits according to the present invention are integrated along with a photosensor array comprising single transistor sensing elements arranged in a matrix of desired size. Each sense amplifier occupies a width equal to or less than the width of a single column in the photosensor array.

BRIEF DESCRIPTION OF THE DRAWING FIGURES

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 1:
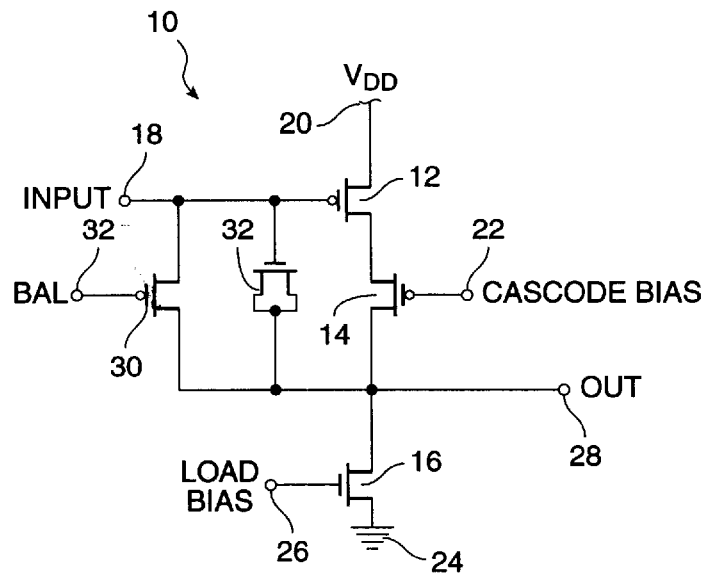
FIG. 1 is a schematic diagram of a presently preferred embodiment of the sense amplifier of the present invention.

The present invention teaches an amplifier design that achieves low noise, high gain, low power dissipation, and a compressive input-output characteristic, all in a narrow width. The schematic diagram of such a sense amplifier 10 is shown in FIG. 1. Sense amplifier 10 comprises input transistor 12, cascode transistor 14, and load transistor 16. In the embodiment of FIG. 1, input transistor 12 is a P-Channel MOS transistor, cascode transistor 14 is a P-Channel MOS transistor, and load transistor 16 is an N-Channel MOS transistor.

Input transistor 12 has its gate connected to input line 18, its source connected to Vdd rail 20, and its drain connected to the source of cascode transistor 14. The gate of cascode transistor 14 is connected to a cascode line 22. Cascode line 22 is connected to a voltage source supplying a cascode bias voltage used to hold input transistor 12 in saturation.

The drain of cascode transistor is connected to the drain of load transistor 16. The source of load transistor 16 is connected to ground rail 24 and the gate of load transistor 16 is connected to load bias node 26. Load bias node 26 is connected to a bias voltage source supplying a load bias voltage well above the threshold voltage of the transistor 16. The output node 28 of amplifier 10 is the common connection of the drains of cascode transistor 14 and load transistor 16.

A balance transistor 30, shown as a P-Channel MOS transistor, is connected between input line 18 and output node 28, and has its gate connected to a BAL signal node 32. In addition, as presently preferred, a varactor structure 32 may be connected between the input and output of amplifier 10. Use of a varactor structure allows compression of the output signal over a wide dynamic range of input signals.

As known in the art, a varactor structure may comprise a large-area MOS transistor. The gate of the MOS transistor comprises one terminal of the varactor structure and the other terminal of the varactor structure comprises the source and drain of the MOS transistor connected together.

Either an N-channel MOS transistor or a P-channel MOS transistor may be used as the varactor according to the present invention. Because, in the presently illustrated application, a positive charge is to be sensed, if an N-channel MOS transistor is used as the varactor as indicated at reference numeral 32, its gate is connected to the input of sense amplifier 10 and its source and drain are connected to the output of sense amplifier 10. If a P-channel MOS transistor is used as the varactor, its source and drain are connected to the input of sense amplifier 10 and its gate is connected to the output of sense amplifier 10.

If a charge of the opposite sign is to be sensed, those of ordinary skill in the art will realize that the connections to the varactor will be reversed. If an application requires sensing charge of both polarities, two varactors connected in opposite directions may be used.

The key to achieving low noise and high gain-bandwidth product is to make both the input transistor 12 and the cascode transistor 14 wide and short, such that they operate in weak inversion (near the threshold voltage of the transistor), whereas the load transistor 16 is made long and relatively narrow (for pitch), so that it operates in strong inversion (well above the threshold voltage of the transistor). In a typical layout of amplifier 10, the w/l ratio of input transistor 12 and cascode transistor 14 will be much greater than the w/l ratio of load transistor 16. For purposes of this disclosure and claims, the w/l ratio of input transistor 12 and cascode transistor 14 is much greater than the w/l ratio of load transistor 16 when it is at least 10 times the w/l ratio of the load transistor. Those of ordinary skill in the art will readily be able to scale these dimensions for arrays of other sizes.

The reason that this design is optimal can be seen as follows: The mean squared voltage noise referred to the gate of the input transistor is the well-known expression:

$$dV^2 = \frac{kT}{g_m} df$$

where $g_m$ is the transconductance of the input stage operating with bias current I, and kT is the thermal voltage. In weak inversion $$g_m = \frac{qI}{kT}$$

whereas in strong inversion $$g_m = \frac{I}{V_g - V_T}$$

where Vg is the gate bias voltage relative to source, and $V_T$ is the threshold voltage of the transistor. The convention is adopted that a positive sign for $Vg-V_T$ corresponds to an increasing current through the transistor. Because strong inversion is defined to be the region for which $Vg-V_T$ >kT/q, for a given current I, the gate-referred noise in weak inversion will always be lower than that in strong inversion. If the input voltage is much less than the threshold voltage, the amplifier will be too slow. If the input voltage is much greater than the threshold voltage, the noise and power dissipation will be too great. Thus, the optimum bias condition for these transistors is for their gate-to-source voltage to be within a few hundred millivolts of their threshold voltage. The absolute limits will depend on factors such as the process, threshold voltage, oxide thickness, etc., as will be appreciated by those of ordinary skill in the art.

Because the load transistor 16 does not have a signal connected to its gate, the noise contributed by it is by way of its current. This current noise is only weakly dependent on whether the load transistor 16 is operated above or below threshold.

Figure 2:
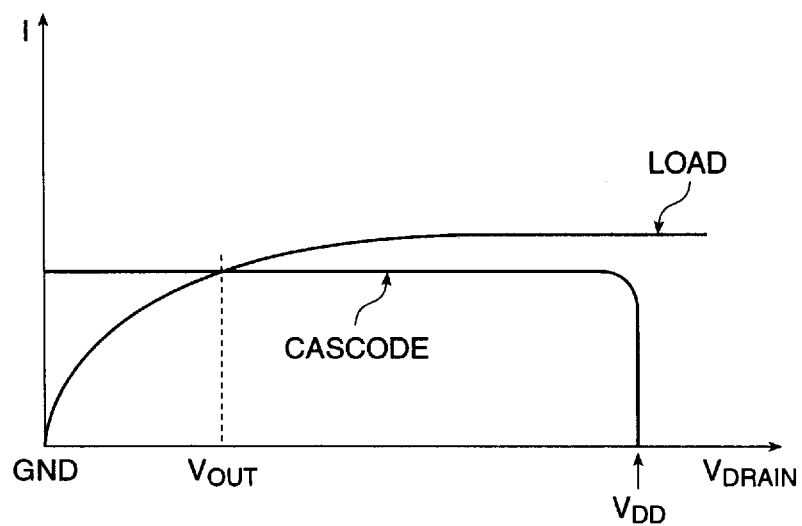
FIG. 2 is a graph showing a typical load-line plot of the currents through the cascode and load transistors of the sense amplifier of FIG. 1.

In order to achieve good current matching, high gain, and a compressive input-output characteristic, the load transistor 16 is operated in strong inversion. The input-output characteristic can be inferred from FIG. 2, which is a typical load-line plot of the currents through the cascode transistor 14 and load transistor 16, as will be readily understood by those of ordinary skill in the art.

The current through the drain of cascode transistor 14 will, of course, be a sensitive function of the voltage at the input line 18, provided the bias on the cascode line 22 is sufficient to bias the drain of the input transistor 12 (source of the cascode transistor 14) into saturation. As may be seen from FIG. 2, the amplifier 10 will have maximum gain when the output is near the positive rail, which it will be after the amplifier has been balanced (output connected to the input by the balance transistor 30), and the amplifier is sensing a very small charge. It is for this reason that P-Channel input and cascode transistors 12 and 14 are used with a NPN photo-transistor array.

From the above discussion, those of ordinary skill in the art will recognize that the present invention may also be used with a PNP photo-transistor array. The difference between such an amplifier and the one depicted in FIG. 1 is that the input and cascode transistors will comprise N-Channel MOS transistors, and the load transistor will comprise a P-Channel MOS transistor.

One of the important aspects of the present invention is the ability to integrate a plurality of sense amplifiers of the present invention into a photo-transistor imaging array such that each sense amplifier occupies only the width of a single pixel in the array.

Figure 3:
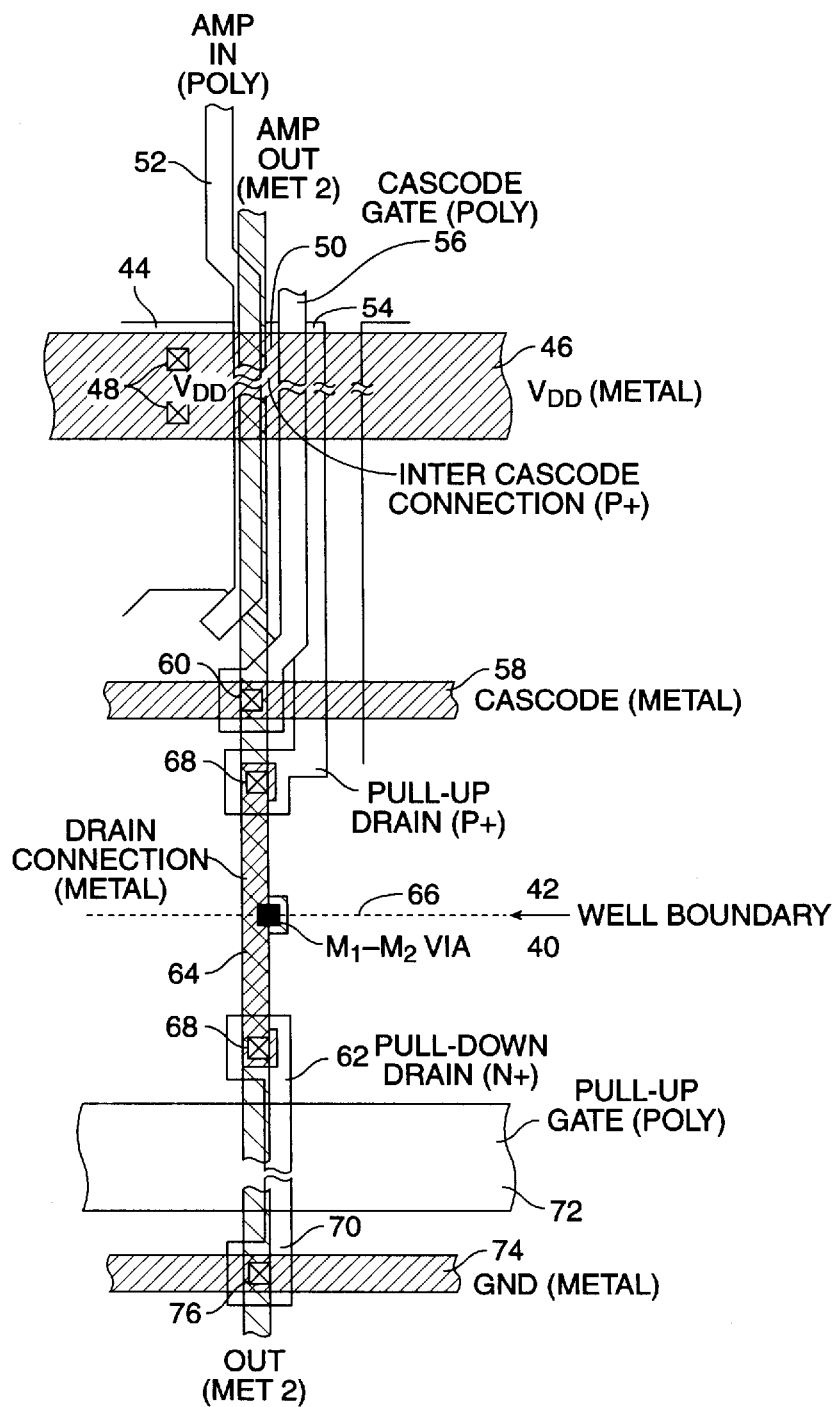
FIG. 3 is a top view of a typical layout of the sense amplifier of FIG. 1.

FIG. 3 is a top view of a typical layout of the sense amplifier of FIG. 1 in which the layout aspect of the present invention is illustrated. Referring now to both FIGS. 1 and 3, the amplifier 10 is fabricated in and on a semiconductor substrate shown generally by reference numeral 40. An n-type well region 42 is disposed in substrate 40 in which the P-Channel devices will be formed. A first doped region 44 in the well 42 forms the source of the P-Channel MOS input transistor 12. First doped region 44 is connected to metal line 46 through contacts 48. Metal line 46 forms the Vdd rail 20 in the schematic diagram of FIG. 1. A second doped region 50 in well 42 spaced apart from first doped region 44 forms the common connection of the both the drain of P-Channel MOS input transistor 12 and the source of P-Channel cascode transistor 14 of FIG. 1. A polysilicon line 52, forming the gate of P-Channel MOS input transistor 12, overlies the space (not shown) between first and second doped regions 44 and 50. This space comprises the channel of input transistor 12.

A third doped region 54 in well 42 forms the drain of cascode transistor 14 of FIG. 1. A polysilicon line 56, forming the gate of P-Channel MOS cascode transistor 14, overlies the space (not shown) between second and third doped regions 50 and 54. This space comprises the channel of cascode transistor 14. A metal line 58 is connected to polysilicon line 56 via contact 60.

A fourth doped region 62 in a region of the substrate 40 outside of well 42 forms the drain of N-Channel MOS output transistor 16 of FIG. 1. A metal line 64 bridges the boundary of well 42 (shown as dashed line 66 and connects third doped region 54 to fourth doped region 62 via contacts 68 as is well known in the art. A fifth doped region 70 in substrate 40 is spaced apart from fourth doped region 62 and forms the source of N-Channel MOS output transistor 16 of FIG. 1. The space between fourth and fifth doped regions 62 and 70 forms the channel of N-Channel MOS output transistor 16 and polysilicon line 72 forms the gate of N-Channel MOS output transistor 16. Metal line 74 forms the ground supply voltage rail and is connected to fifth doped region 70 via contact 76.

Those of ordinary skill in the art will note that breaks are indicated in the figure for the first, second, and third doped regions 44, 50, and 54, and for the polysilicon lines 52, 56 and 62, indicating that input and cascode transistors which these elements comprise are longer than is shown in the drawing figure. This is in accordance with a feature of the invention discussed previously.

In the embodiment shown in FIG. 3, well 42 is an n-type region in a p-type substrate, containing p-type doped regions for the sources and drains of the P-Channel input and cascode transistors. The source and drain regions for the N-Channel output transistor are n-type regions. Those of ordinary skill in the art will readily recognize that the polarity may be reversed, i.e., a p-type well containing n-type doped regions for sources and drains of N-Channel input and cascode transistors could be disposed in a n-type substrate containing p-type doped regions for the source and drain of a P-Channel output transistor, without departing from the scope or spirit of the present invention. Likewise, in an n-well process, the input and cascode transistors can be n-channel, disposed in the substrate, and the load transistor can be p-channel, located in the well.

As may be seen from an examination of FIG. 3, the sense amplifier of the present invention may be formed in an extremely narrow area of the substrate 40 and in fact may be the same width as one of the pixel columns in a photo-transistor sensor array. The Vdd rail comprising metal line 46, cascode metal line comprising metal line 58, polysilicon line 72, forming the gate of N-Channel MOS output transistor 26, and ground line 74 are all oriented horizontally in FIG. 3 and those of ordinary skill in the art will readily recognize how a plurality of sense amplifiers in the present invention may be disposed side-by-side, all making common connections to metal lines 46, 58, and 74 for Vdd, ground, and the cascode bias voltage. Polysilicon line 72 will form the gates for all sense amplifier load transistors in the array. Polysilicon line 52 forming the input to the sense amplifier, and metal line 64 forming the output of the sense amplifier are shown running in the vertical direction of FIG. 3 for ease of making input and output connections to and from the sense amplifier.

Figure 4:
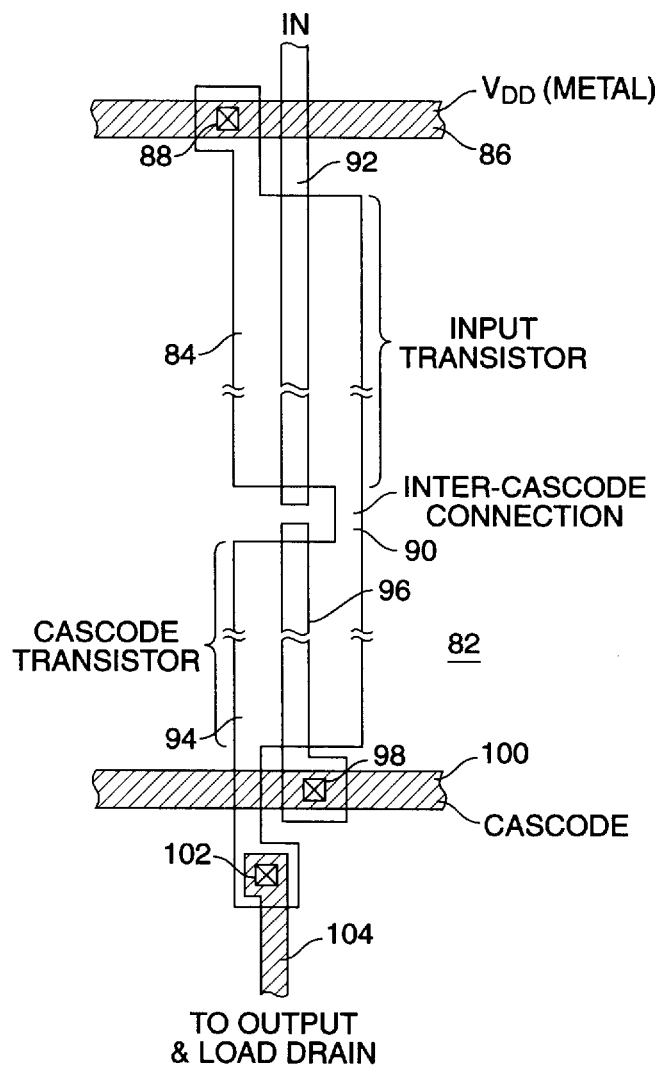
FIG. 4 is a top view of an alternate typical layout of the portion of the sense amplifier of FIG. 1 including the input transistor and the cascode transistor.

FIG. 4 is a top view of an alternate typical layout of the portion of the sense amplifier of FIG. 1 which includes the input transistor and the cascode transistor. The remainder of the layout of the sense amplifier of this embodiment (not shown) including the load transistor will be identical to the load transistor portion of the sense amplifier shown in FIG. 3. Referring now to FIG. 4, a well 82 includes a first doped region 84 (shown vertically-oriented in the drawing) which comprises the source of input transistor 12 of FIG. 1. First doped region 84 is connected to metal line 86 supplying Vdd through contact 88. As with the embodiment of FIG. 3, when the amplifier of FIG. 4 is utilized in an array, metal line 86 will cross and be connected to the doped regions forming the sources of the input transistors of all amplifiers serving an array.

A second doped region 90 in well 82 is oriented parallel to first doped region 84, is spaced apart therefrom and is slightly offset therefrom. Second doped region 90 forms the drain of the input transistor 12 of FIG. 1 and the source of the cascode transistor 14 of FIG. 1. The space in well 82 in between first and second doped regions 84 and 90 forms the channel for the input transistor 12. A polysilicon line 92 overlies the channel, which is thus not shown in the figure, and forms the gate of input transistor 12.

A third doped region 94 in well 82 is oriented parallel to second doped region 84, is spaced apart therefrom and is slightly offset therefrom. Third doped region 94 lies below and on axis with first doped region 84. Third doped region 94 forms the drain of the cascode transistor 14 of FIG. 1. The space in well 82 in between second and third doped regions 90 and 94 forms the channel for the cascode transistor 14. A polysilicon line 96 overlies the channel of the cascode transistor, which is thus not shown in the figure, and forms the gate of cascode transistor 14. A contact 98 connects the polysilicon line 96, the gate of the cascode transistor, with a metal line 100 comprising the cascode voltage bias line. As with the embodiment of FIG. 4, when the amplifier of FIG. 4 is utilized in an array, metal line 100 will cross and be connected to the polysilicon lines forming the gates of the cascode transistors of all amplifiers serving an array.

A contact 102 connects the bottom of third doped region 94 to metal line 104. Those of ordinary skill in the art will recognize that metal line 104 is equivalent to metal line 64 and connects the drain of the P-Channel cascode transistor in the well to the drain of the N-Channel output transistor in the substrate, as well as forming the output node of the sense amplifier of the present invention.

As indicated in FIG. 4 by the breaks shown in first and second doped regions 84 and 90 and polysilicon line 92, the input transistor may have a length greater than that shown in the figure. In addition, as indicated in FIG. 4 by the breaks shown in second and third doped regions 90 and 94 and polysilicon line 96, the cascode transistor also may have a length greater than that shown in the figure. This is in accordance with an aspect of the present invention which has been previously discussed herein.

The embodiment of FIG. 3 is presently preferred over the embodiment of FIG. 4 because it minimizes the capacitance on the node comprising the drain of input transistor 12 and the source of cascode transistor 14, thus improving the stability and bandwidth of the amplifier.

Figure 5:
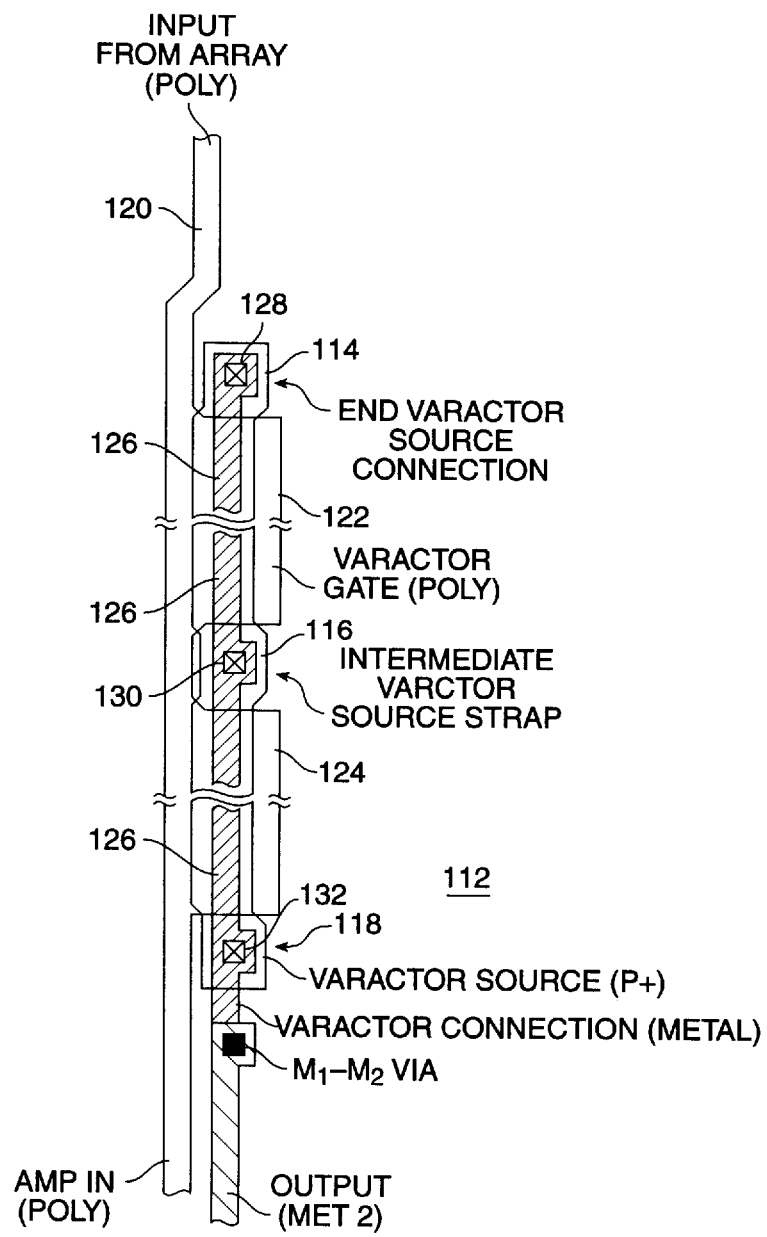
FIG. 5 is a top view of a layout of a varactor element which may be used in combination with the sense amplifier of the present invention.

FIG. 5 is a top view of a varactor device 110 which may be employed as device 32 in FIG. 1 with the sense amplifier of FIGS. 3, and 4. Varactor 110 may be placed between the array and sense amplifier in a typical application, and the following description assumes such placement in an integrated circuit containing an array, varactors, and sense amplifiers as described herein, although such placement is not necessary for practice of the present invention. FIG. 5 illustrates an N-Channel varactor device, although those of ordinary skill in the art will readily be able to fabricate a P-Channel varactor device as well.

Referring now to FIG. 5, a semiconductor substrate 112 includes a first doped region 114 forming an end varactor source strip. A second doped region 116 is spaced apart from the first doped region and forms an intermediate source strip. A third doped region 118 is spaced apart from second doped region 116 and forms an end varactor source strip. A polysilicon line 120, carrying the output signal from the array column with which the varactor 110 is associated, runs past doped regions 114, 116, and 118 and includes laterally-extending fingers 122 and 124 which extend over channel regions (not shown) defined between doped regions 114 and 116 and 116 and 118, respectively. These laterally-extending fingers 122 and 124 form the gate of the varactor. Vertically-extending metal line 126 connects the first, second, and third doped regions 114, 116, and 118 together through contacts 128, 130, and 132, respectively. Metal line 126 will connect to metal line 64 of FIG. 3 or metal line 104 of FIG. 4 (the output node of the sense amplifier of the present invention), and polysilicon line 120 will connect with polysilicon line 52 of FIG. 3 or polysilicon line 92 of FIG. 4 (the input node of the sense amplifier of the present invention), thus placing varactor 110 across the input and output of the sense amplifier.

According to another aspect of the present invention, the thermal kTC charge noise on the output column line connecting the pixel to the charge-sense amplifier is compensated for by use of a correlated double sampling circuit. In accordance with the teaching of the present invention that a plurality of sense amplifiers of the present invention are integrated into a photo-transistor imaging array such that each sense amplifier occupies only the width of a single pixel in the array, the double correlated sampling circuit is integrated into a photo-transistor imaging array such that each double correlated sampling circuit occupies only the width of a single pixel in the array.

The correlated double sampling circuit of the present invention is interposed between the charge-sense amplifier that senses the charge dumped on a column line, and a horizontal scanner circuit that stores the charge-sense amplifier output for each column for subsequent serial output. Correlated double sampling is a well-known technique used in the art of electronic imager design. Correlated double sampling is used to reduce thermal noise fluctuations on large capacitances.

Any capacitance that is in thermal equilibrium displays thermal charge fluctuation; the mean-square charge fluctuation in units of square coulombs is kTC, where k is Boltzman's constant, T is the temperature in degrees Kelvin, and C is the capacitance in Farads.

Correlated double sampling is necessitated in CMOS imager designs by large thermal kTC charge noise on the output column line connecting the pixel to the charge-sense amplifier. Charge fluctuation on the column occurs while the charge-sense amplifier is being reset prior to sensing the pixel output. During reset, the sense amplifier is balanced by shorting the amplifier output to the column. During this phase of the sense cycle, the column is connected to a source of charge and comes to thermal equilibrium.

For a typical column capacitance of 10 pF (1000 pixels each with 10 fF capacitance), the RMS charge fluctuation is about 1000 electrons at room temperature. When the reset switch in the charge-sense amplifier is opened to place the amplifier in a sensitive state, this charge fluctuation is frozen on the column line, and acts just like pixel output charge. When the pixel is strobed, dumping its signal charge onto the column, this signal is added to the thermal charge fluctuation already introduced during the balance phase of the charge-sense amplifier.

Correlated double sampling discounts the balance-phase charge fluctuation, outputting only the signal. In correlated double sampling, the sense amplifier output is sampled after the amplifier has been reset and placed in a sensitive state, and then sampled again after the pixel charge is strobed onto the column and the sense amplifier has settled. The sampling is "correlated" because it is synchronized with the reset/sense phases of the charge sense amplifier. The first sample captures the kTC column charge fluctuation, while the second sample captures the sum of the kTC fluctuation and the pixel output signal. The output of correlated double sampling is the difference between the two samples, representing just the pixel output.

Figure 6:
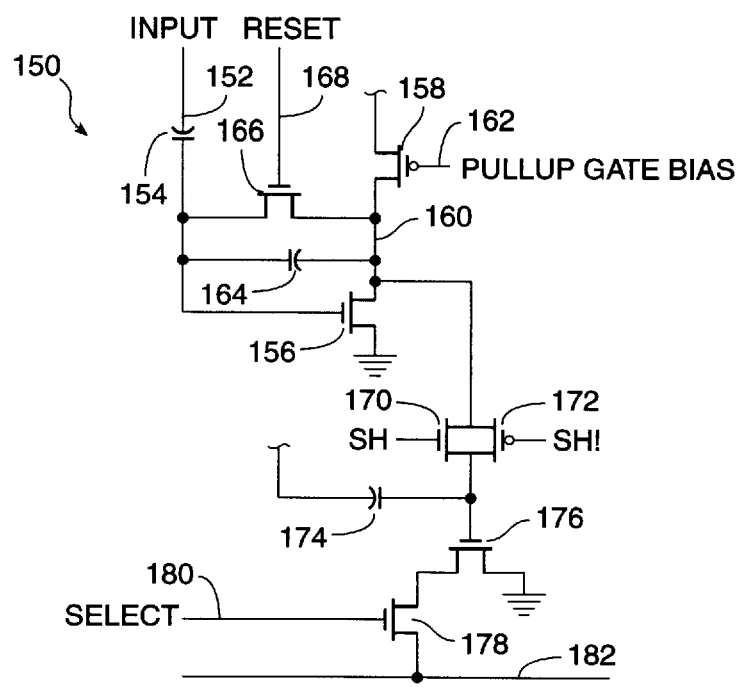
FIG. 6 is a schematic diagram of a presently preferred embodiment of a correlated double sampling circuit according to the present invention.

Referring now to FIG. 6, double correlated sampling circuit 150 is shown in schematic diagram form. Double correlated sampling circuit 150 has an input node 152 coupled to the output of the sense amplifier of FIG. 1. A first plate of input capacitor 154 forms the input node 152. Input capacitor 154 has a capacitance of between about 100 fF and about 10 pF. In a double poly process, input capacitor 154 may be formed from two layers of polysilicon and the interpoly dielectric. Capacitors having an active region in the substrate may be employed as will be disclosed further herein to allow utilization of a single poly process for fabricating the array of the present invention.

The second plate of input capacitor 154 is connected to the gate of an N-Channel input transistor 156. The source of N-Channel input transistor 156 is grounded and its drain is connected to the drain of a P-Channel MOS load transistor 158 to form the output node 160 of the double correlated sampling circuit. The source of P-Channel MOS load transistor 158 is connected to the positive voltage rail, and its gate is connected to a pullup gate signal line 162.

Feedback capacitor 164 has a first plate connected to the output node 160 and a second plate connected to the second plate of the input capacitor 154. N-Channel reset transistor 166 is connected between output node 160 and the second plate of the input capacitor 154. The gate of N-Channel reset transistor 166 is driven from a reset signal line 168.

The output from the charge-sense amplifier (reference numeral 28 in FIG. 1) is input to the correlated double sampling circuit 150. The output from the correlated double sampling circuit at output node 160 is input to the sample/hold switch, comprising a pass gate including N-Channel MOS transistor 170 and P-Channel MOS transistor 172, which stores the correlated double sampling output on a sample/hold capacitor 174 with complementary pulses on lines SH and SH! The voltage on the sample/hold capacitor 174 biases a column output transistor 176 that is used for serial output. A select transistor 178, enabled by select line 180 connected to its gate, places the column output produced by column output transistor 176 onto output line 182.

Those of ordinary skill in the art will notice that the fixed plate of sample/hold capacitor 174 is connected to the positive voltage rail. This connection becomes preferable over the connection to the negative rail when an n-well single level poly process is used with a p-base fixed capacitor plate, since the fixed plate of sample/hold capacitor 174 is an active substrate region which must be kept in accumulation to prevent changes of capacitance with changes of applied voltage as will be disclosed more fully herein.

As will be appreciated by persons of ordinary skill in the art, correlated double sampling circuit 150 in the presently preferred embodiment comprises a near unity-gain inverting amplifier having an input capacitively-coupled from the sense amplifier by input capacitor 154. Feedback capacitor 156 provides capacitive feedback from the output node 160 of inverting amplifier output to its input. N-Channel MOS reset transistor 166 comprises a reset switch across the feedback capacitor 166 to balance the correlated double sampling circuit 150 during and after the reset phase of the sense amplifier, until the sense amplifier has settled to its high-sensitivity state. During correlated double sampling reset, the output of correlated double sampling circuit 150 is held clamped at a fixed level. When the N-Channel MOS transistor 166 reset switch is turned on, the output 160 of the correlated double sampling circuit 150 remains at this fixed reset level, effectively sampling the sense amplifier output. When the sense amplifier subsequently senses the pixel output, the output of correlated double sampling circuit 150 tracks the sense amplifier output with unity inverting gain, starting from the correlated double sampling reset point, which is independent of the sense amplifier kTC reset fluctuation.

The importance of the gain in the pixel and the influence of thermal noise in the column charge sense amplifiers can be demonstrated by comparing the shot noise in the pixel with thermal noise from the charge sense amplifier, and computing the Signal-To-Noise (SNR) ratio.

At the pixel, shot noise determines the statistics of charge collection by the pixel base. If N charges are collected on the average by the base during the integration time, then counting statistics in this Poisson process indicate that the variance in the number of charges collected is also N. Let Q=qN be the mean charge integrated by the base. If the pixel has gain β, then the variance in the pixel output charge amplified onto the emitter during readout is $q^2\beta N = q^2\beta Q/q = \beta qQ$, where q is the elementary charge. This calculation assumes β>1, so that the amplification itself negligibly adds noise. Hence, shot fluctuation in the pixel charge amplified onto the column is $$\Delta Q_s = \sqrt{\beta q Q}$$

The quantum efficiency of the pixel is factored into β. Now we can compute the thermal noise contributed by the charge sense amplifier. Correlated double sampling removes the kTC charge fluctuation on the column that is introduced during sense amplifier reset. However, the charge sense amplifier still produces thermal noise during the sensing of the pixel charge output. The charge sense amplifier operates in a feedback loop while sensing the pixel charge. Feedback in the sense amplifier is capacitive, contributing no thermal noise. Almost all of the thermal noise is generated by the charge sense amplifier input transistor. The amplifier input transistor has gate-referred voltage noise density (volts squared per unit bandwidth).

$$dV^2 = \frac{kT}{g_m}$$

Referred back to the column, the mean square column charge fluctuation from the sense amplifier noise (over its full bandwidth) is approximately $$\Delta Q_t = \sqrt{kTC}$$

where C is the column capacitance. This result is obtained as follows. The input (column) referred mean square thermal charge fluctuation arising from the sense amplifier is computed by multiplying the gate-referred mean square voltage noise $dV^2$ by the square of the column capacitance $C^2$ and the bandwidth of the amplifier in the closed loop sensing state, gm/C. The produce is kTC. It has been assumed that no capacitance loads the sense amplifier output, and that the full bandwidth of the sense amplifier is detected by seceding stages.

The integrated pixel charge at which the shot noise from the pixel is equal to the thermal noise in the column amplifier is obtained by equating $q\beta Q=kTC$:

$$Q = \frac{kTC}{q\beta}$$

At this level, the pixel shot noise and column thermal noise are about equal, where $kT/q=VT$ is the thermal voltage (25 mV at room temperature). Hence CVT may be called the thermal charge of the column. It can be observed that when $$Q < \frac{CVT}{\beta}$$

the column sense amplifier noise dominates the pixel shot noise. For example, if C=1-pF, then $CVT/q=1.5\times10^6$. With $\beta=100$, only at Q=15,000 q is shot noise comparable to thermal noise. Clearly, thermal noise is dominant in realistic situations.

The signal charge $\beta Q$ to noise fluctuation charge $\Delta Q_s$, $+\Delta Q_t$ ratio can be computed for any given signal charge Q as follows $$SNR = \frac{\beta Q}{\sqrt{\beta q Q + kTC}} = \frac{\beta Q}{\sqrt{kTC}}$$

wherein it has been assumed that the amplified pixel charge is much greater than a single charge. Now it can be observed that the SNR is equal to the amplified pixel charge divided by the thermal column charge fluctuation. The SNR is proportional to pixel gain $\beta$. For the numerical example of column capacitance and pixel gain just given, $$\frac{\sqrt{kTC}}{q} = 1250e$$

with $\beta=100$, Q=12.5e results in SNR=1.

At a typical saturation pixel base charge capacity of around $10^5$e, the SNR is about $10^4$, using the preceding example parameters for $\beta$ and C.

Accordingly, pixel gain $\beta$ is fundamental in determining system detection capabilities. Passive pixel imagers, with $\beta=1$, are severely limited in their detection capabilities.

The correlated double sampling amplifier cancels the kTC reset fluctuation from the charge sense amplifier. The correlated double sampling amplifier has its own kTC reset fluctuation and its own thermal noise fluctuation while buffering the sense amplifier signal. In the presently preferred embodiment, the correlated double sampling amplifier operates at near unity-gain. The resulting mean square thermal charge fluctuation in the correlated double sampling amplifier, referred back to charge fluctuation on the column, is approximately $$\Delta Q_{cds} = C_f \sqrt{\frac{kT}{C_{cds}}}$$

where $C_f$ is the feedback capacitor used in the charge sense amplifier. The ratio of correlated double sampling amplifier noise to sense amplifier kTC noise is $$\frac{\Delta Q_{cds}}{\Delta Q_t} = \frac{C_f \sqrt{\frac{kT}{C_{cds}}}}{\sqrt{kTC}} = \frac{C_f}{\sqrt{CC_{cds}}}$$

It can be observed that for any realistic values, this ratio is much less than unity. Hence, the correlated double sampling process negligibly increases total noise.

Figure 7A:
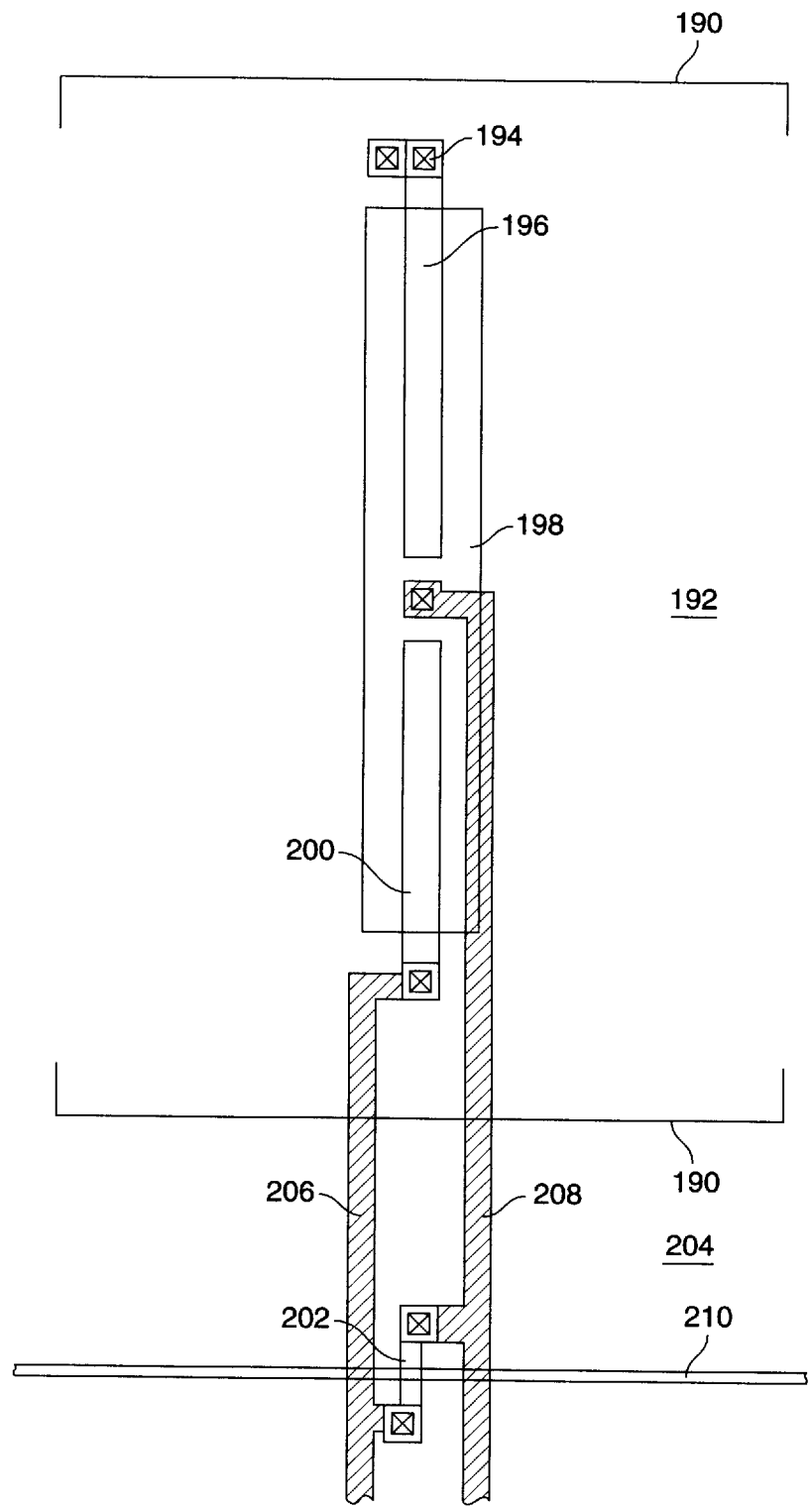
FIGS. 7a through 7c are top views of adjacent portions of a typical layout of the correlated double sampling circuit of FIG. 6.
Figure 7B:
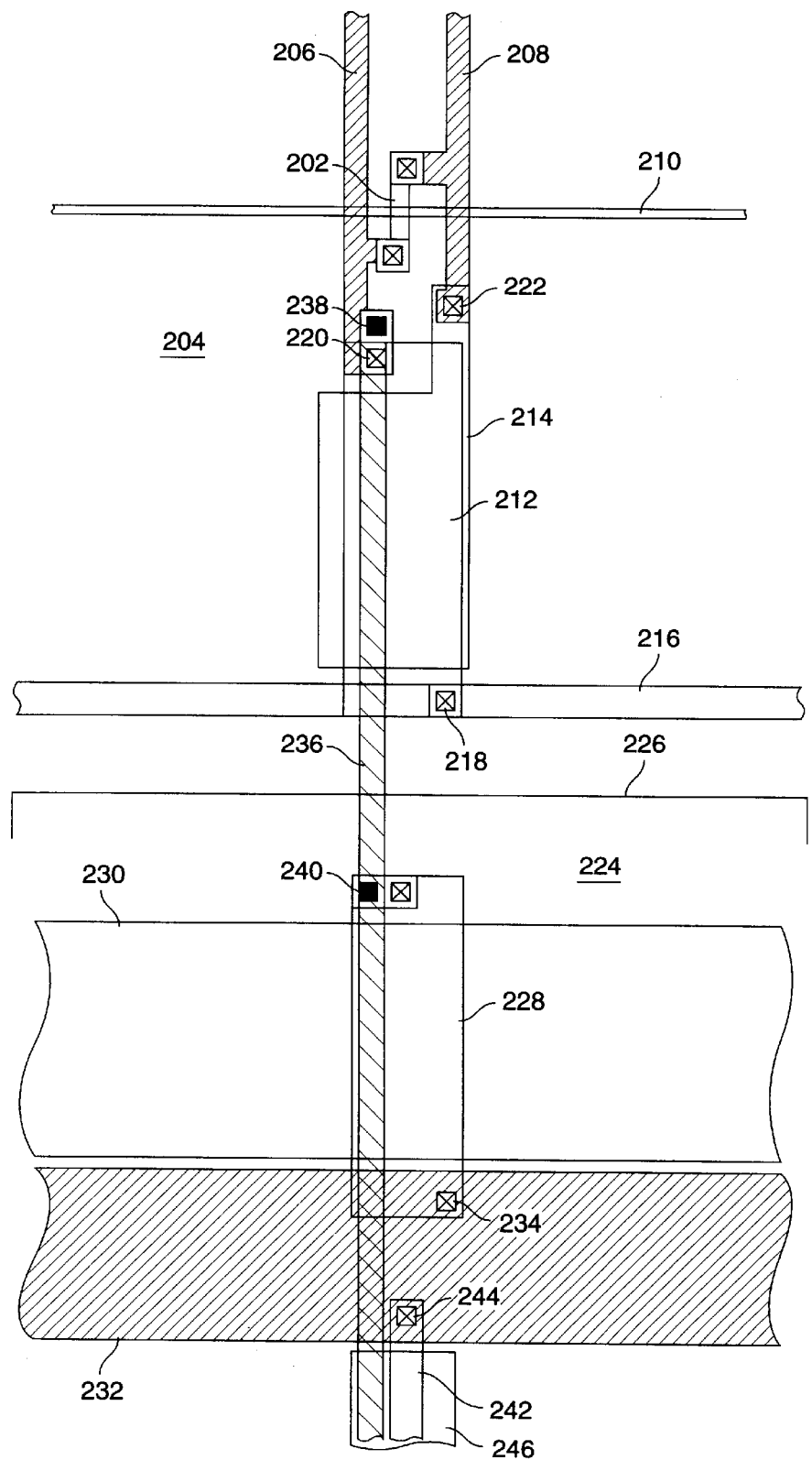
Figure 7C:
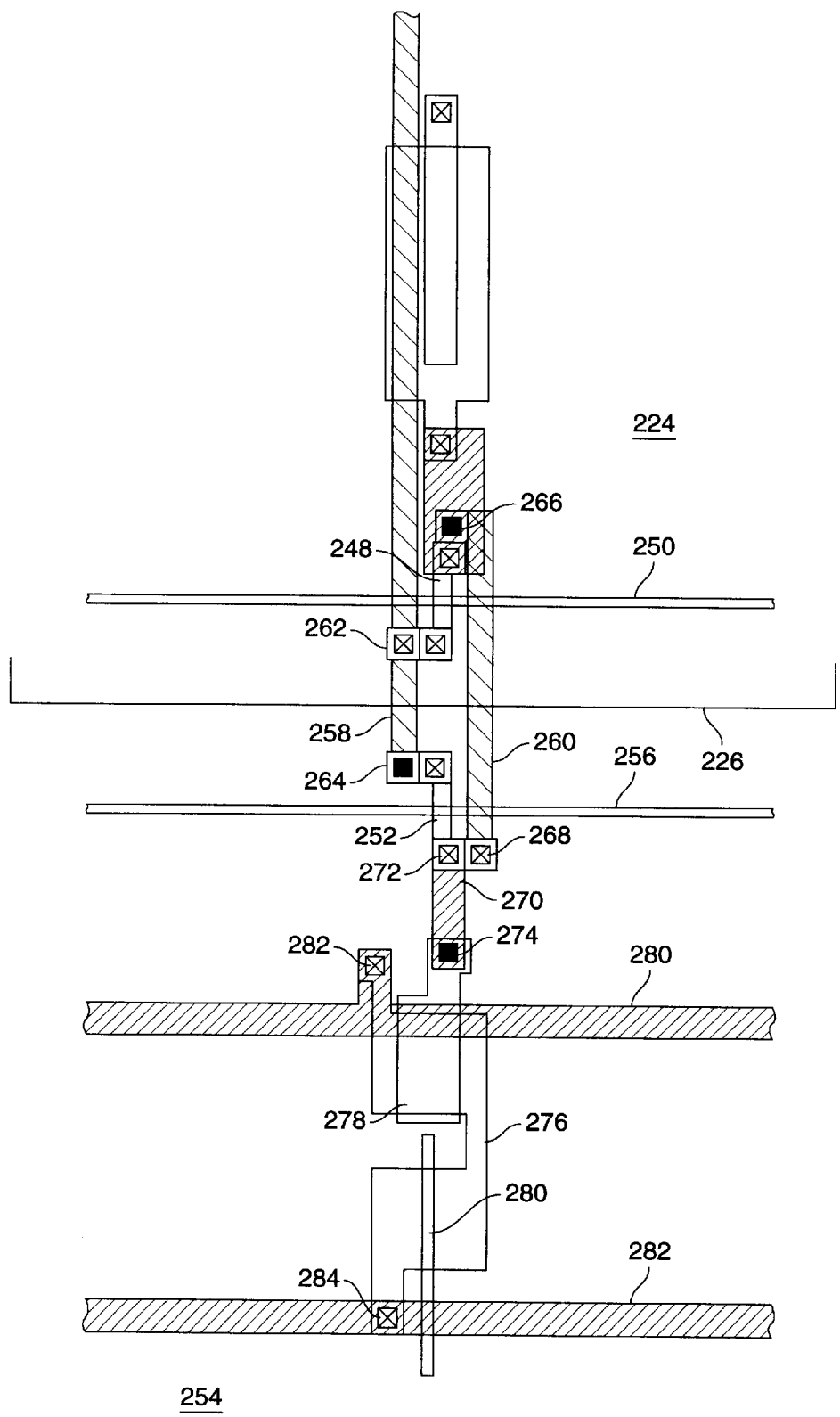

Referring now to FIGS. 7a through 7c, a top view of a typical layout for the circuitry depicted in FIG. 6 is shown. According to the aspect of the invention illustrated in FIGS. 7a through 7c, a plurality of correlated double sampling circuits of the present invention are integrated into a phototransistor imaging array such that each correlated double sampling circuit occupies only the width of a single pixel in the array, along with the sense amplifiers as previously described. The input capacitor 154, feedback capacitor 164, and sample/hold capacitor 174 are formed between the active regions in the substrate and a layer of polysilicon according to another aspect of the present invention.

Referring first to FIG. 7a, a portion of a top view of a layout of the circuit of FIG. 6 depicts input node 152, input capacitor 154, and feedback capacitor 164 along with N-Channel MOS reset transistor 166. Lines 190 indicate the borders of an n-well 192 in which input capacitor 154 and feedback capacitor 164 are formed. The regions outside lines 190 represent the surface of p-type semiconductor substrate.

Contact 192 connects the output of the sense amplifier to a first p-base region 196 in the n-well 192. First p-base region 196 forms the input plate of input capacitor 154 of FIG. 6, and thus the input node 152 of correlated double sampling circuit 150 of FIG. 6. A second non-contiguous p-base region 200 formed in n-well 192 and aligned generally parallel to p-base region 196, forms the second plate of feedback capacitor 164 common with the output node 160 of correlated double sampling circuit 150 of FIG. 6. A layer of polysilicon 198 overlying and insulated from p-base regions 196 and 200, forms the common second plate of input capacitor 154 and first plate of feedback capacitor 164.

N-Channel MOS reset transistor 166 of correlated double sampling circuit 150 of FIG. 6 is seen in the bottom of FIG. 7a and comprises an active n-region 202 in the p-type substrate region 204. A first metal line 206 connects the second plate (output node side) of feedback capacitor 164 to a first source/drain region in n-region 202 and a second metal line 206 connects the first plate (common to second plate of input capacitor 154) of feedback capacitor 164 to a second source/drain region in n-region 202. Those of ordinary skill in the art will recognize that horizontal polysilicon line 210 forms the gate of N-Channel MOS reset transistor 166 of correlated double sampling circuit 150 of FIG. 6 and defines the first and second source/drain regions of that device. Such skilled persons will also recognize that polysilicon line 210 extends to the left and right to form the gates of the reset transistors for all adjacent correlated double sampling circuits for the other columns in the array.

Referring now to FIG. 7b, a second portion of the top view of a typical layout for the circuitry depicted in FIG. 6 is shown. For viewing convenience and to help correlate FIG. 7b with FIG. 7a, the top view of N-Channel reset transistor 166 of FIG. 6 is repeated at the top of FIG. 7b.

In FIG. 7b, N-Channel MOS input transistor 156 of FIG. 6 is shown formed in the p-type substrate region 204 next to (below in the drawing) the structure comprising N-Channel reset transistor 166. N-Channel MOS input transistor 156 of FIG. 6 comprises active N Channel region 212 with its overlying polysilicon gate 214. The source of N-Channel MOS input transistor 156 is grounded to metal line 216 through contact 218 as is well known in the art. Those skilled in the art will realize that metal line 216 extends beyond the left and right margins of FIG. 7a and forms the ground connection for all N-Channel input transistors in the array.

The drain of N-Channel MOS input transistor 156 is connected to output node 160, one of the source/drain regions of N-Channel MOS reset transistor 166, and the second plate of feedback capacitor 164 by an extension of metal line 206 and contact 220. The gate of N-Channel MOS input transistor 156 is connected to the first plate of feedback capacitor 164, the other source/drain region of N-Channel MOS reset transistor 166, and the second plate of input capacitor 154 by an extension of metal line 208 and contact 222.

P-Channel MOS load transistor 158 of FIG. 6 is formed in an n-well 224 defined below line 226 in FIG. 7b. P region 228 defines the device and polysilicon line 230 defines a source at its lower end, shown stitched to Vdd metal line 232 via contact 234. Those skilled in the art will realize that metal line 232 extends beyond the left and right margins of FIG. 7a and forms the Vdd connection for all P-Channel load transistors in the array. The top of P region 228 forms the drain of P-Channel MOS load transistor 158 of FIG. 6 and is connected to the drain of the N-Channel MOS input transistor by metal line 236 and contacts 238 and 240.

Continuing down FIG. 7b, and also shown at the top of FIG. 7c to which attention is now drawn, sample hold capacitor 174 of FIG. 6 includes a first plate comprising p-base region 242 disposed in n-well 224 connected to the Vdd metal line 232 via contact 244. The second plate of sample/hold capacitor 174 of FIG. 6 comprises polysilicon layer 246. Immediately below sample/hold capacitor 174, the P-Channel transistor 172 of the sample/hold switch of FIG. 6 is formed in the n-well 224 from P region 248. Horizontal polysilicon line 250 forms the gate of this device. Horizontal polysilicon line 250 extends to the left and right to form the gates of the P-Channel transistors of all of the sample/hold switches in the array.

Immediately below line 226 defining the lower border of n-well 224, N region 252 disposed in p-type substrate region 254 forms the N-Channel MOS transistor 170 of the sample/hold switch. Horizontal polysilicon line 256 forms the gate of this device and extends to the left and right to form the gates of the P-Channel transistors of all of the sample/hold switches in the array. Metal lines 258 and 260 and associated contacts 262, 264, 266, and 268 serve to connect the N-Channel and P-Channel MOS transistors in parallel with one another.

Metal line 270 and contacts 272 and 274 connect the output side of the sample/hold switch to polysilicon region 278. The top portion of N region 276 forms N-Channel column output transistor 176 of FIG. 6 having polysilicon region 278 as its gate. The upper portion of N region 276 to the left of polysilicon region 278 forms the source of N-Channel MOS column output transistor 176 and is connected to the metal ground line 280 through contact 282. Metal line 280 extends to the left and right to form the ground connections for the sources of the other N-Channel MOS column output transistors in the array. The right side of the upper portion of N region 276 forms the drain of N-Channel MOS column output transistor 176. The right side of the lower portion of N region 276 forms the drain of N-Channel column select transistor 178 of FIG. 6. Polysilicon layer 280 forms the gate of this device and its source at the left side of the lower portion of N region 276 forms its source, which is connected to output metal line 282 through contact 284. Metal line 282 is the output line onto which all of the column outputs are multiplexed and thus it runs left to right across the entire array.

Figure 8:
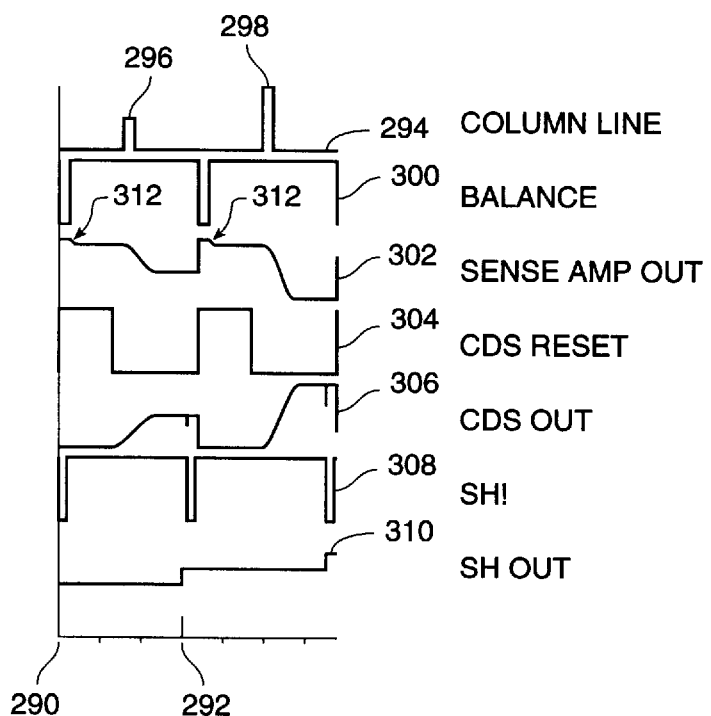
FIG. 8 is a timing diagram showing the operation of the sense amplifier, correlated double sampling circuit, and sample/hold circuit of FIG. 6.

Referring now to FIG. 8, a timing diagram showing the timing of the column amplifier charge-sense, correlated double sampling, sample/hold cycle is presented. The correlated double sampling circuit 150 of the present invention is reset during and after sense amplifier reset, and is placed in its sensitive state during the actual sense phase of operation. FIG. 8 shows a simulation of column circuit behavior. The simulation covers two complete cycles, representing two rows of pixels from the array. The first cycle begins at reference numeral 290 and the second cycle begins at reference numeral 292.

In this simulation, the pixel output onto the column is modeled as a square pulse of current onto the sense amplifier input and is the top trace on the left identified by reference numeral 294. All other traces are voltages.

In the first cycle, approximately 10000 electrons are dumped onto the column line, in the second, approximately 40000 electrons are dumped onto the column line as may be seen from the differing heights of square pulses 296 and 298 in first trace 294. The Balance input to the balance transistor 30 of FIG. 1 is shown at the second trace 300. The sense amplifier output is shown at the third trace 302. The reset signal line 168 of FIG. 6 is shown in the fourth trace identified by reference numeral 304. The voltage on the output node 160 of the correlated double sampling circuit 150 of FIG. 6 is shown in the fifth trace identified by reference numeral 306. The SH! signal line connected to P-Channel MOS sample/hold switch transistor 172 of FIG. 6 is shown in the third sixth identified by reference numeral 308. The output of the sample/hold circuit of FIG. 6 is shown at reference numeral 310.

The simulation begins with P-Channel MOS balance transistor 30 in the sense amplifier of FIG. 1, N-Channel MOS reset transistor 166 in FIG. 6, and the N-Channel and P-Channel sample/hold switch transistors 170 and 172 turned on. Ordinarily, the sample/hold switches 170 and 172 and the P-Channel MOS balance transistor 30 are non-overlapping, as shown at traces 300 and 308 in the subsequent cycles. kTC column noise would appear as variations in the sense amplifier output settled level after sense amplifier reset is finished and Bal is raised, and are indicated by arrows 312 pointing from "Charge injection+kTC".

The correlated double sampling circuit of the present invention removes thermal charge fluctuations appearing on large column capacitances during sense amplifier reset. If the circuit layout shown in FIGS. 7a through 7c is employed, the correlated double sampling circuit of the present invention fits in the same narrow pitch as the sense amplifier.

The fabrication process for fabrication of the array disclosed in the present invention is a standard single- or double-poly CMOS process. When poly-diffusion capacitors such as are shown in FIGS. 7a through 7c are employed, a single-poly process may be used.

A poly-diffusion capacitor may be formed using polysilicon as the top plate and base diffusion as the bottom plate, with gate oxide serving as the capacitor dielectric. The base diffusion, unlike normal source/drain diffusion, is not masked by poly. To maintain fixed capacitance, the surface is kept in accumulation. In the case of the NPN imaging array, the p-base diffusion forms the lower capacitor plate (just as in the pixel itself). In the PNP imager, the n-well base forms the bottom plate.

It is desirable to arrange the circuit so that floating nodes like the correlated double sampling circuit input are attached to the poly plates of capacitors, to avoid leakage of the floating charge via parasitic photocurrent from the capacitor diffusion.

To accumulate the surface, the poly voltage must be held at a potential that turns off the parasitic channel. In the NPN imager, the poly must be held at a lower potential than the pbase, to attract the majority carrier holes to the surface in a thin accumulation layer. Moreover, the base doping must be arranged so that even at zero potential difference, the surface is not depleted, because during amplifier reset, the potential is zeroed.

The capacitor plate polarities must be arranged so that any swings away from the reset condition of zero polarity further accumulates the surface. The circuit described in the drawing figures herein is illustrative of such a circuit.

In the column circuit, it is convenient to arrange the capacitor polarities so that these conditions are always satisfied. In FIG. 6, the column circuit from the NPN imager, the poly-pbase capacitors are represented with the poly plate drawn as a straight line and the base plate drawn as a curved line. Every floating node except the sense amplifier input is attached to poly capacitor plates. The reset states and voltage swing polarities of every capacitor only drive them further into accumulation. The sense amplifier balances near the positive supply and swings negative from there. The correlated double sampling amplifier balances near ground and swings positive from there. In each case, the voltage swing increases accumulation.

Circuit mismatch effects in the column amplifier are minimized by the use of a small number of large transistors 156, 158, and 176 running above-threshold in the output of the column amplifier. DC offsets in the sense amplifier are completely removed. Remaining offsets only arise from the two transistors 156 and 158 in the correlated double sampling circuit and a single column output transistor 176.

The correlated double sampling circuit efficiently utilizes the available dynamic voltage signal range by operating in a complementary manner to the sense amplifier.

Power consumption in the single correlated double sampling circuit is low; a single correlated double sampling circuit typically runs with less than 100 nA supply current. An imaging array with 1000 correlated double sampling circuits and a 3V supply voltage uses less than 1 mW for correlated double sampling.

As previously mentioned, the sense amplifier of the present invention is particularly useful in an application wherein a plurality of such sense amplifiers are employed on an integrated circuit along with a photosensing array, such as the single-transistor photosensing array disclosed and claimed in any one of U.S. Pat. Nos. 5,097,305, 5,260,592, and 5,324,958. When used with such an array, a single sense amplifier can be laid out to occupy a width on the semiconductor substrate equal to the width of a single column of photosensing transistor elements. This allows fabrication of a compact and efficient array and sensing combination having a wide dynamic range.

Figure 9:
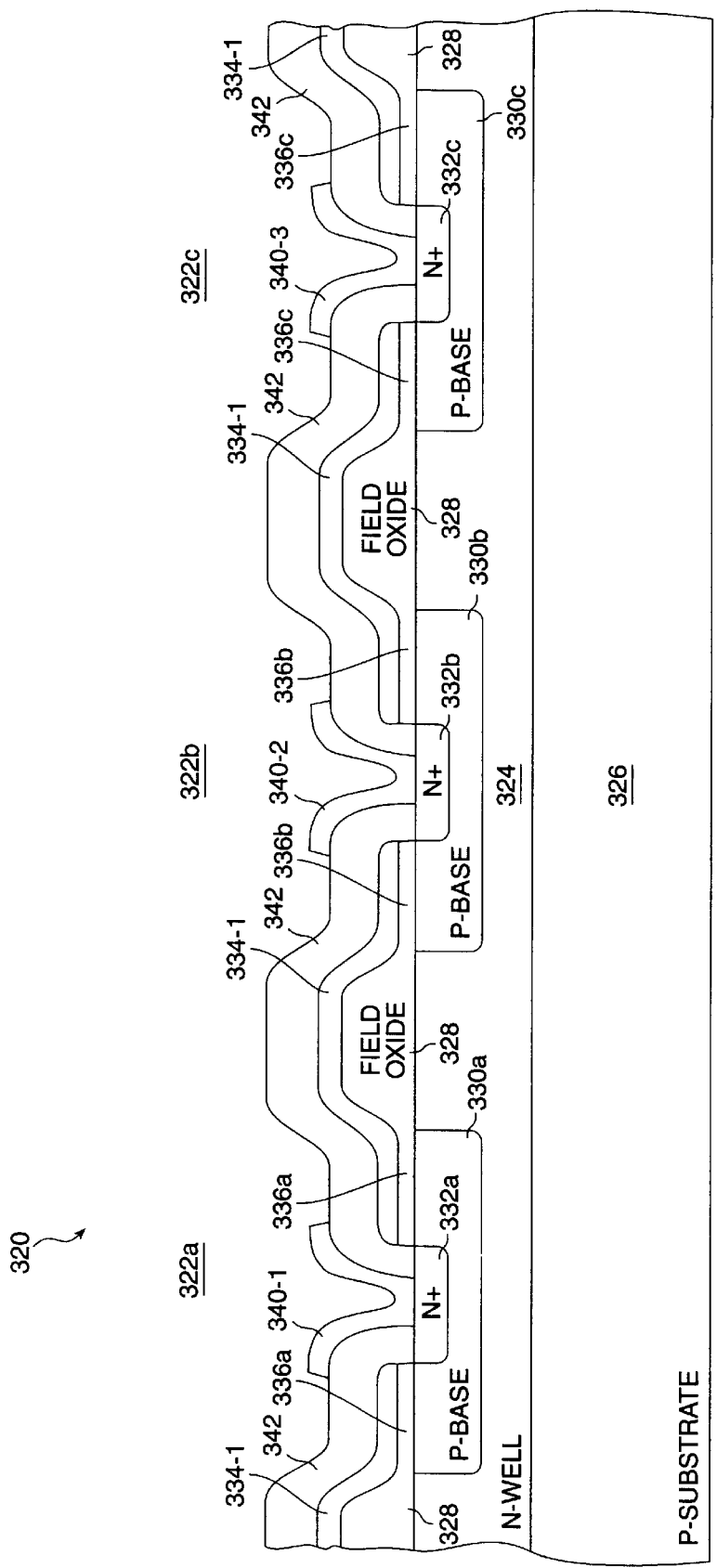
FIG. 9 is a cross-sectional view of a layout of a portion of an array of single transistor integrating photosensors according to an aspect of the invention implemented in an N-well CMOS process taken along an axis parallel to one row thereof in a position which bisects a row-select line of the array.

FIG. 9 is a cross-sectional view of a layout of a portion of an array of single transistor integrating photosensors according to an aspect of the invention implemented in an N-well CMOS process taken along an axis parallel to one row thereof in a position which bisects a row-select line of the array. The cross-section of FIG. 9 bisects a row-select line of the array. The portion of the array shown in FIG. 9 three columns of one-transistor integrating photosensors.

Those of ordinary skill in the art will readily understand that the embodiment of FIG. 9 is merely illustrative and that practical arrays fabricated according to the principles of the present invention are likely to be substantially larger. The practical limit on array size is largely a function of CMOS processing limitations.

In FIG. 9, array 320 is shown to include an exemplary row of integrating photosensors including photosensors 322a, 322b, and 322c, fabricated in n-well 324, formed in p-type substrate 326 using conventional processing techniques. Integrating photosensors 322a, 322b, and 322c may be separated by conventionally formed field oxide regions 328, as is well known in the art. Those of ordinary skill in the art will immediately recognize that region 324 could itself be an n-type semiconductor substrate instead of being an n-well in a p-type semiconductor substrate. This is may be seen in FIG. 8 if region 326 is ignored.

P-type base regions 330a, 330b, and 330c, formed in regions of n-well 324 between birds beaks or in apertures etched in a uniformly grown field oxide 328, comprise the base regions of the NPN bipolar transistors comprising integrating photosensors 322a, 322b, and 322c, respectively. The minimum inter-pixel distance is set by the inter-base spacing. The base doping is chosen such that the base surface concentration is larger than the well-surface concentration but light enough so that the base-emitter reverse leakage characteristic is not degraded by incipient breakdown at the reverse bias voltage used for integrating the photo-generated charge. Doping is also such that the poly-p-base capacitors, such as regions 334-1 to 330a are accumulated at zero voltage bias.

N-region 324 forms the common collectors for bipolar transistor integrating photosensors 322a, 322b, and 322c, and N+emitter regions 332a, 332b, and 332c, form the emitters of bipolar transistor integrating photosensors 322a, 322b, and 322c, respectively. Conductive row-select line 334-1 comprises a line of conductive material, such as polysilicon, metal silicide or any other conductive layer which may be employed as a gate in a CMOS process. Row-select line 334-1 line runs the length of the row over field oxide regions 328 and gate oxide regions 336a, 336b, and 336c. Deposited oxide layer 342 covers row-select line 334-1. Column sense lines 170-1, 170-2, and 170-3 are shown in end view disposed over deposited oxide layer 342 and contacting emitters 332a, 332b, and 332c of integrating photosensors 322a, 322b, and 322c, respectively.

Examination of FIG. 9 reveals that the emitter regions are substantially self aligned to the edges of the polysilicon layer forming row-select line 334-1. This is a result of the fact that the emitter regions are created during the self-aligned gate source/drain implant step simultaneously with the sources and drains of the MOS transistors on the integrated circuit. Those of ordinary skill in the art will realize that this provides the advantage of minimizing the emitter-to-row-select-line capacitance in the integrating photosensors.

Figure 10:
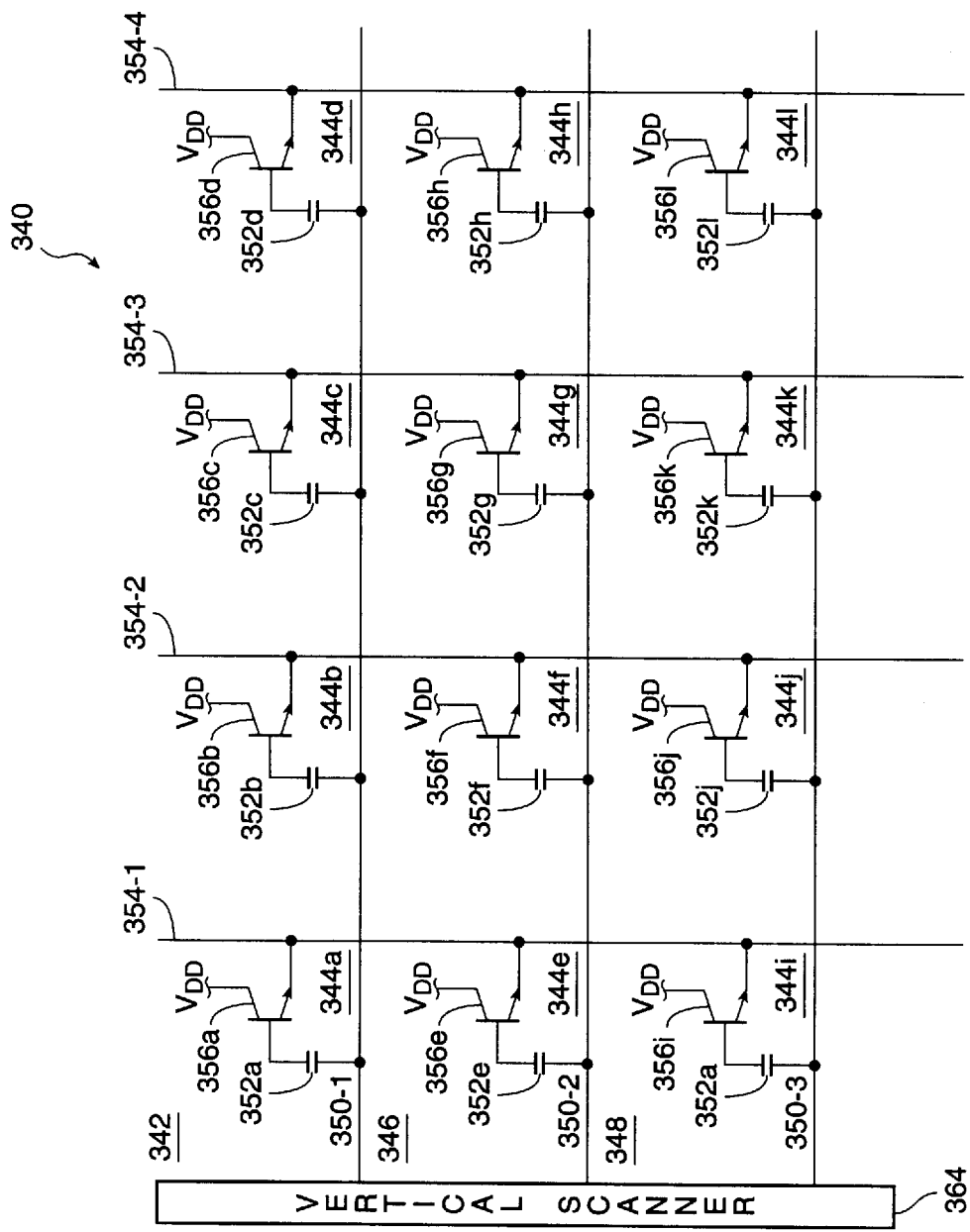
FIG. 10 is a block diagram of an imaging array comprising bipolar transistor integrating photosensors according to a presently preferred embodiment of the invention.

FIG. 10 is a block diagram of the sensing portion of an imaging array 340 comprising bipolar transistor integrating photosensors according to a presently preferred embodiment of the invention. The array 340 of FIG. 10 is shown including twelve integrating photosensors according to the present invention arranged into three rows and four columns. Those of ordinary skill in the art will readily observe that the embodiment shown in FIG. 10 is illustrative and not limiting in nature, and that an array of any size is contemplated by the present invention, limited only by the inherent density and chip size limitations of CMOS technology.

Row 342 of array 340 includes photosensors 344a–344d. Row 346 of array 340 includes photosensors 344e–344h. Row 348 of array 340 includes photosensors 344i–344l. In FIG. 10, photosensors 344a–344l are illustrated as bipolar integrating photosensors. Those of ordinary skill in the art will recognize that other integrating photosensor elements may be used in place of the integrating photosensor element shown in FIG. 10.

First row-select line 350-1 is connected to one plate of capacitors 352a–352d. Second row-select line 350-2 is connected to one plate of capacitors 352e–352h. Third row-select line 350-3 is connected to one plate of capacitors 352i–352l. First sense line 354-1 is connected to the emitters of phototransistors 356a, 356e, and 356i of the first column in the array 340. Second sense line 354-2 is connected to the emitters of phototransistors 356b, 356f, and 356j of the second column in the array 340. Third sense line 354-3 is connected to the emitters of phototransistors 356c, 356g, and 356k of the third column in the array 340. Fourth sense line 354-4 is connected to the emitters of phototransistors 356d, 356h, and 356l of the fourth column in the array 340.

Figure 11:
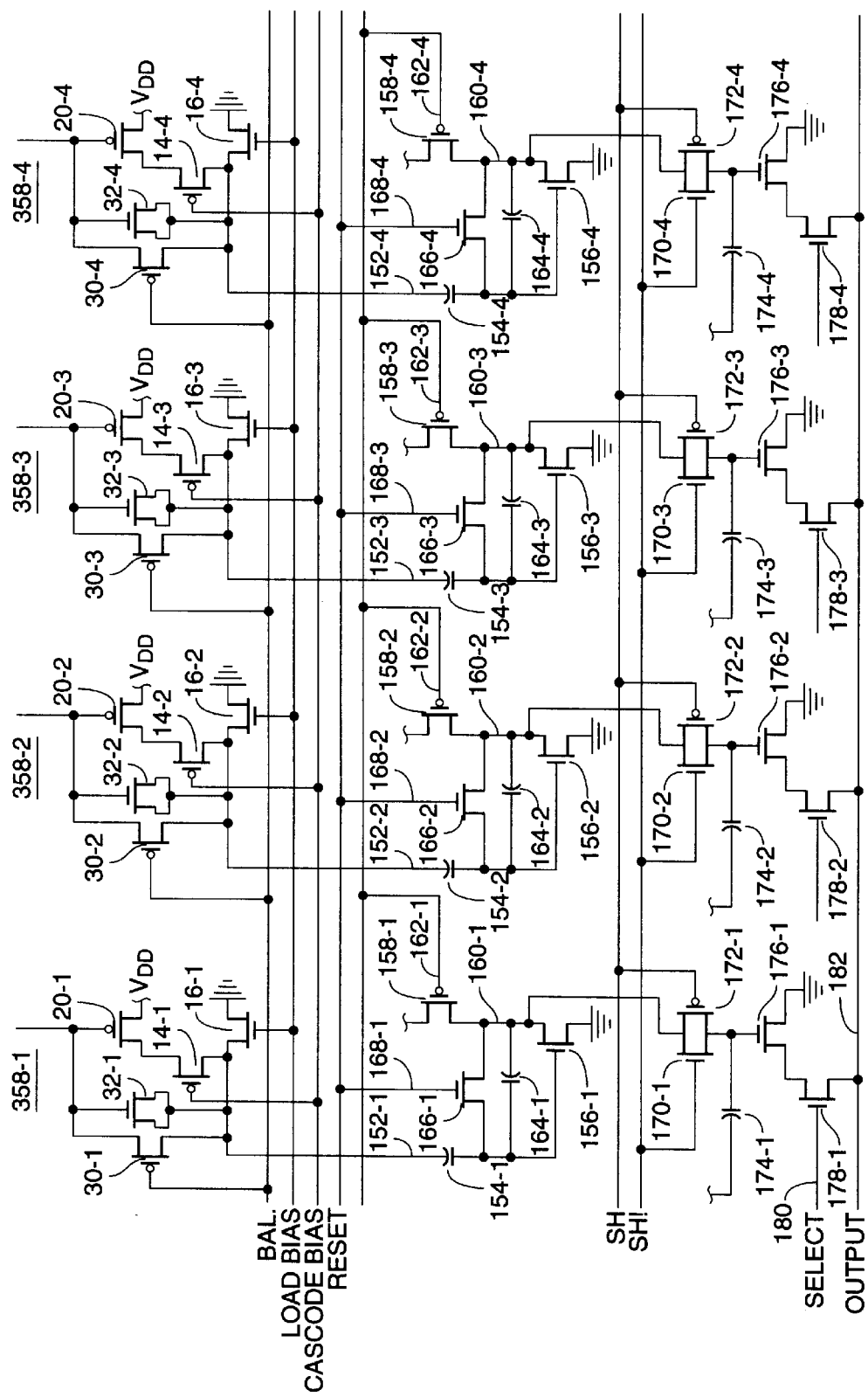
FIG. 11 is a schematic diagram of illustrative sense amplifiers, correlated double sampling circuits, and sample/hold circuits used with the array of FIG. 10.

Referring now to FIG. 11, a schematic diagram of the array column sense circuitry employing a plurality of narrow profile sense amplifiers and narrow profile correlated double sampling circuits and sample/hold circuits is shown. First sense amplifier 358-1 is connected to first sense line 354-1. Second sense amplifier 358-2 is connected to second sense line 354-2. Third sense amplifier 358-3 is connected to third sense line 354-3. Fourth sense amplifier 358-4 is connected to fourth sense line 354-4. Sense amplifiers 358-1 through 358-4 are the sense amplifiers disclosed herein. As will be apparent from the discussion accompanying FIG. 2a, a row of pixels from array 340 may be read by pulsing balance line 360, driving the gates of balance transistors 362-1 through 362-4, followed by bringing the desired one of row lines 350-1 through 350-3 to a high logic level.

The outputs of sense amplifiers 358-1, 358-2, 358-3 and 358-4 are connected to the inputs of correlated double sampling circuits 360-1, 360-2, 360-3 and 360-4, respectively.

In a presently preferred embodiment, a vertical scanning circuit 364 is adapted to select only one of the row select lines 350 at any given time. Circuits for performing this function are well known in the art.

According to a presently-preferred embodiment of the invention, the outputs of all of the sense amplifiers are captured by sample/hold circuits 366-1 through 366-4 so that they may be scanned out while the sense amplifiers are sensing charge from the next row of pixels. As presently preferred, sample/hold circuits 366-1 through 366-4 may comprise pass gates 368-1 through 368-4 and capacitors 210-1 through 210-4. The N-Channel and P-Channel MOS transistors comprising the pass gates are conventionally driven by complementary signals SAMPLE and SAMPLE! on lines 212 and 214 as is well known in the art. The advantage of employing the sample/hold circuits is that the sense amplifiers have an entire line time to settle, and the residual charge on each row of pixels is much less than if the amplifier outputs were scanned directly.

As those of ordinary skill in the art will readily appreciate, the timing of the operation of the array of FIG. 9 is straightforward. Vertical scanner 364 selects a one of the rows of pixels. After the settling time for the sensing of charge in the selected row of pixels has passed, a sampling pulse is used to activate the pass gates 366-1 through 366-4 for a time long enough to charge capacitors 210-1 through 210-4 with the voltage outputs of the sense amplifiers 198-1 through 198-4. Horizontal scanner is then used to scan the output values out of the array. Vertical scanner 364 selects another row and the data acquisition and scanning process repeats until the pixel data for the entire array or selected portion thereof has been read out by horizontal scanner 216.

In a true serial scanned imager, horizontal scanning circuitry 216 is adapted to select the signal from the output of one of sample/hold circuits 92-1 through 92-4 at a given time, to form the output 104 of the array. Exemplary scanning circuits suitable for use as vertical and horizontal scanning circuits 90 and 102 are described in Analog VLSI and Neural Systems, by Carver A. Mead, Addison Wesley Publishing Co., 1989, at pp. 263–267. If parallel outputs are desired, all amplifier outputs can be used directly, or subsets can be sequentially selected by horizontal scanning circuit 102.

Figure 12:
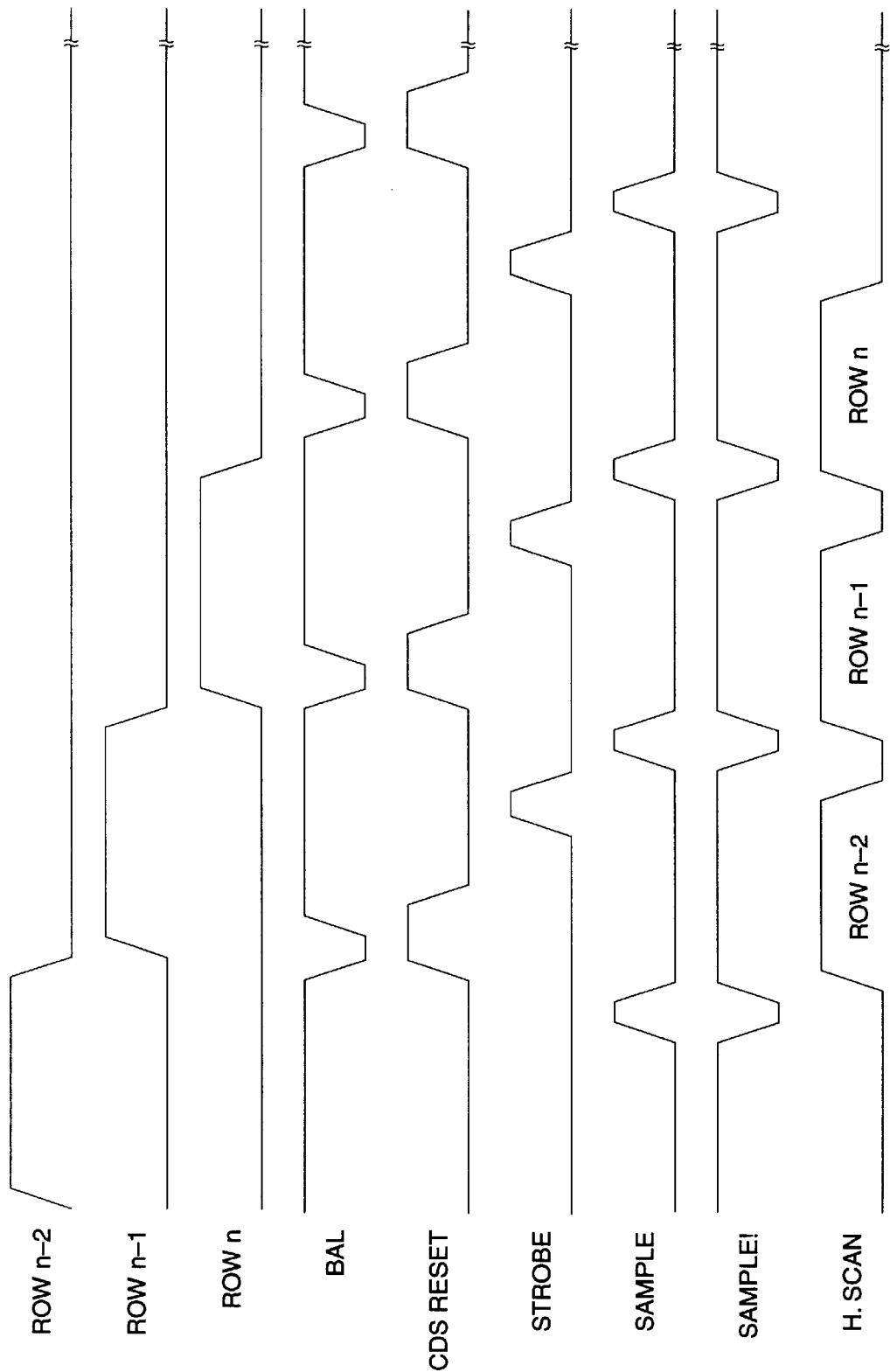
FIG. 12 is a timing diagram showing a typical timing sequence for the signals to the array, sense amplifiers, correlated double sampling circuits, and sample/hold circuits of FIGS. 10 and 11 during three illustrative row scan cycles necessary for the operation of a typical array like the one of FIG. 9.

FIG. 12 is a timing diagram showing a typical timing sequence for the signals to row lines, vertical scanner 90, SAMPLE line 98 and SAMPLE! line 100, and horizontal scanner 102 during three illustrative row scan cycles necessary for the operation of a typical array like the one of FIG. 9. Circuitry for providing the signals shown in FIG. 10 is conventional and design of such circuitry is well within the level of ordinary skill in the art. From FIG. 10, it may be seen that the signals driving the row lines may come from a serial shift register or a typical one of N decoder circuit. The SAMPLE and SAMPLE! signals may be generated on chip or may be generated off chip using a microcontroller. Note that the horizontal scanner control signal (H. Scan) is shown as a scan period during which either serial scanning, such as by analog multiplexer, or parallel scanning, such as by enabling pass gates, may take place during the period when the H. Scan signal is high. Selection of serial or parallel scanning is a matter of design choice.

It is well known in the art that a pixel outputting a current instead of a charge may be employed in an imaging array. The sense amplifier present invention may be used with such an array by substituting a current feedback element for the varactor 32 of FIG. 1.

While embodiments and applications of this invention have been shown and described, it would be apparent to those skilled in the art that many more modifications than mentioned above are possible without departing from the inventive concepts disclosed herein. The invention, therefore, is not to be restricted except in the spirit of the appended claims.

What is claimed is:

1. A correlated double sampling circuit comprising:

an input node comprising a first plate of input capacitor;

an output node;

a feedback capacitor having a first plate connected to said output node and a second plate connected to a second plate of said input capacitor;

an input transistor having a gate connected to said second plate of said input capacitor, a source connected to a first supply voltage rail, and a drain connected to said output node;

a load transistor having a gate connected to a bias node, a drain connected to said output node, and a source connected to a second supply voltage rail; and a reset transistor connected between output node and said second plate of the input capacitor, and having a gate connected to a reset signal line.

* * * * *